(12) United States Patent
Martinian et al.

(10) Patent No.: US 7,003,712 B2
(45) Date of Patent: Feb. 21, 2006

(54) APPARATUS AND METHOD FOR ADAPTIVE, MULTIMODE DECODING

(76) Inventors: Emin Martinian, 16 B Jerome St., Medford, MA (US) 02155; Carl-Erik W. Sundberg, 25 Hickory Pl. A-11, Chatham, NJ (US) 07928

(*) Notice: Subject to any disclaimer, the term of this patent is extended or adjusted under 35 U.S.C. 154(b) by 766 days.

(21) Appl. No.: 09/996,661

(22) Filed: Nov. 29, 2001

(65) Prior Publication Data

US 2003/0101408 A1    May 29, 2003

(51) Int. Cl.
H03M 13/00     (2006.01)
H03M 13/03     (2006.01)

(52) U.S. Cl. ........................... 714/761; 714/787
(58) Field of Classification Search ............... 714/701, 714/752, 755, 756, 758, 761, 762, 746, 787, 714/786, 788, 791, 795, 712, 751, 43, 48; 375/240.27, 262, 265, 259, 260, 340, 341
See application file for complete search history.

(56) References Cited

U.S. PATENT DOCUMENTS

| | | | | |
|---|---|---|---|---|
| 4,764,927 A | * | 8/1988 | Izumita et al. | 714/761 |
| 4,979,174 A | * | 12/1990 | Cheng et al. | 714/774 |
| 5,870,412 A | * | 2/1999 | Schuster et al. | 714/752 |
| 5,983,385 A | * | 11/1999 | Khayrallah et al. | 714/755 |
| 6,694,478 B1 | * | 2/2004 | Martinian et al. | 714/788 |
| 6,728,924 B1 | * | 4/2004 | Lou et al. | 714/776 |

* cited by examiner

Primary Examiner—Christine T. Tu

(57) ABSTRACT

The present invention provides for adaptive and multimode decoding, in a data packet-based communication system, to provide improved received signal quality in the presence of burst erasures or random bit errors, with particular suitability for real-time, delay sensitive applications, such as voice over Internet Protocol. In the presence of burst erasures, the adaptive multimode decoder of the present invention provides burst erasure correction decoding, preferably utilizes a maximally short (MS) burst erasure correcting code, which has a comparatively short decoding delay. Depending upon the level of such burst erasures, different rate MS codes may be utilized, or other codes may be utilized, such as hybrid or multidescriptive codes. When no burst erasures are detected, the adaptive multimode decoder of the present invention provides random bit error correction decoding, in lieu of or in addition to corresponding burst erasure correction coding.

29 Claims, 6 Drawing Sheets

FIG. 2

| $\bar{y}[i]=$ | $x[i]$ | $x[i-3]$ |
|---|---|---|
| $\bar{y}[i+1]=$ | $x[i+1]$ | $x[i-2]$ |
| $\bar{y}[i+2]=$ | $x[i+2]$ | $x[i-1]$ |
| $\bar{y}[i+3]=$ | $x[i+3]$ | $x[i]$ |
| $\bar{y}[i+4]=$ | $x[i+4]$ | $x[i+1]$ |
| $\bar{y}[i+5]=$ | $x[i+5]$ | $x[i+2]$ |
| $\bar{y}[i+6]=$ | $x[i+6]$ | $x[i+3]$ |
| $\bar{y}[i+7]=$ | $x[i+7]$ | $x[i+4]$ |

FIG. 3

| $\bar{y}[0]=$ | $x_0[0]$ | $x_1[0]$ | $x_2[0]$ | $0$ |
|---|---|---|---|---|
| $\bar{y}[1]=$ | $x_0[1]$ | $x_1[1]$ | $x_2[1]$ | $x_0[0]$ |
| $\bar{y}[2]=$ | $x_0[2]$ | $x_1[2]$ | $x_2[2]$ | $x_0[1] \oplus x_1[0]$ |
| $\bar{y}[3]=$ | $x_0[3]$ | $x_1[3]$ | $x_2[3]$ | $x_0[2] \oplus x_1[1] \oplus x_2[0]$ |
| $\bar{y}[4]=$ | $x_0[4]$ | $x_1[4]$ | $x_2[4]$ | $x_0[3] \oplus x_1[2] \oplus x_2[1]$ |

FIG. 4

| | | | | | |
|---|---|---|---|---|---|
| | $\tilde{y}[0]=$ | $x_0[0]$ | $x_1[0]$ | $x_2[0]$ | $0$ |
| | $\tilde{y}[1]=$ | $x_0[1]$ | $x_1[1]$ | $x_2[1]$ | $x_0[0]$ |
| | $\tilde{y}[2]=$ | $x_0[2]$ | $x_1[2]$ | $x_2[2]$ | $x_0[1] \oplus x_1[0]$ |
| | $\tilde{y}[3]=$ | $x_0[3]$ | $x_1[3]$ | $x_2[3]$ | $x_0[2] \oplus x_1[1] \oplus x_2[0]$ |
| SYMBOL ERASED → | $\tilde{y}[4]=$ | $x_0[4]$ | $x_1[4]$ | $x_2[4]$ | $x_0[3] \oplus x_1[2] \oplus x_2[1]$ |
| DECODE $x_0[4]$ HERE → | $\tilde{y}[5]=$ | $x_0[5]$ | $x_1[5]$ | $x_2[5]$ | $x_0[4] \oplus x_1[3] \oplus x_2[2]$ |
| DECODE $x_1[4]$ HERE → | $\tilde{y}[6]=$ | $x_0[6]$ | $x_1[6]$ | $x_2[6]$ | $x_0[5] \oplus x_1[4] \oplus x_2[3]$ |
| DECODE $x_2[4]$ HERE → | $\tilde{y}[7]=$ | $x_0[7]$ | $x_1[7]$ | $x_2[7]$ | $x_0[6] \oplus x_1[5] \oplus x_2[4]$ |

FIG. 5

| | | | | | |
|---|---|---|---|---|---|
| | $\tilde{y}[0]=$ | $x_0[0]$ | $x_1[0]$ | $x_2[0]$ | $0$ |
| | $\tilde{y}[1]=$ | $x_0[1]$ | $x_1[1]$ | $x_2[1]$ | $0$ |
| | $\tilde{y}[2]=$ | $x_0[2]$ | $x_1[2]$ | $x_2[2]$ | $x_0[0]$ |
| | $\tilde{y}[3]=$ | $x_0[3]$ | $x_1[3]$ | $x_2[3]$ | $x_0[1]$ |
| | $\tilde{y}[4]=$ | $x_0[4]$ | $x_1[4]$ | $x_2[4]$ | $x_0[2] \oplus x_1[0]$ |
| | $\tilde{y}[5]=$ | $x_0[5]$ | $x_1[5]$ | $x_2[5]$ | $x_0[3] \oplus x_1[1]$ |
| SYMBOL ERASED → | $\tilde{y}[6]=$ | $x_0[6]$ | $x_1[6]$ | $x_2[6]$ | $x_0[4] \oplus x_1[2] \oplus x_2[0]$ |
| SYMBOL ERASED → | $\tilde{y}[7]=$ | $x_0[7]$ | $x_1[7]$ | $x_2[7]$ | $x_0[5] \oplus x_1[3] \oplus x_2[1]$ |
| RECOVER $x_0[6]$ HERE → | $\tilde{y}[8]=$ | $x_0[8]$ | $x_1[8]$ | $x_2[8]$ | $x_0[6] \oplus x_1[4] \oplus x_2[2]$ |
| RECOVER $x_0[7]$ HERE → | $\tilde{y}[9]=$ | $x_0[9]$ | $x_1[9]$ | $x_2[9]$ | $x_0[7] \oplus x_1[5] \oplus x_2[3]$ |
| RECOVER $x_1[6]$ HERE → | $\tilde{y}[10]=$ | $x_0[10]$ | $x_1[10]$ | $x_2[10]$ | $x_0[8] \oplus x_1[6] \oplus x_2[4]$ |
| RECOVER $x_1[7]$ HERE → | $\tilde{y}[11]=$ | $x_0[11]$ | $x_1[11]$ | $x_2[11]$ | $x_0[9] \oplus x_1[7] \oplus x_2[5]$ |
| RECOVER $x_2[6]$ HERE → | $\tilde{y}[12]=$ | $x_0[12]$ | $x_1[12]$ | $x_2[12]$ | $x_0[10] \oplus x_1[8] \oplus x_2[6]$ |
| RECOVER $x_2[7]$ HERE → | $\tilde{y}[13]=$ | $x_0[13]$ | $x_1[13]$ | $x_2[13]$ | $x_0[11] \oplus x_1[9] \oplus x_2[7]$ |

FIG. 6

|  | | | | |
|---|---|---|---|---|
| $\tilde{y}[0]=$ | $x_0[0]$ | $x_1[0]$ | $x_2[0]$ | 0 |
| $\tilde{y}[1]=$ | $x_0[1]$ | $x_1[1]$ | $x_2[1]$ | $P(x_0[0],0,0,0)$ |
| $\tilde{y}[2]=$ | $x_0[2]$ | $x_1[2]$ | $x_2[2]$ | $P(x_0[1],x_0[0],0,0)$ |
| SYMBOL ERASED → $\tilde{y}[3]=$ | $x_0[3]$ | $x_1[3]$ | $x_2[3]$ | $P(x_0[2],x_0[1],x_1[0],x_2[0])$ |
| SYMBOL ERASED → $\tilde{y}[4]=$ | $x_0[4]$ | $x_1[4]$ | $x_2[4]$ | $P(x_0[3],x_0[2],x_1[1],x_2[1])$ |
| RECOVER $x_0[3], x_0[4]$ HERE → $\tilde{y}[5]=$ | $x_0[5]$ | $x_1[5]$ | $x_2[5]$ | $P(x_0[4],x_0[3],x_1[2],x_2[2])$ |
| RECOVER $x_1[3], x_2[3]$ HERE → $\tilde{y}[6]=$ | $x_0[6]$ | $x_1[6]$ | $x_2[6]$ | $P(x_0[5],x_0[4],x_1[3],x_2[3])$ |
| RECOVER $x_1[4], x_2[4]$ HERE → $\tilde{y}[7]=$ | $x_0[7]$ | $x_1[7]$ | $x_2[7]$ | $P(x_0[6],x_0[5],x_1[4],x_2[4])$ |

FIG. 7

| | | |
|---|---|---|
| $\tilde{y}[i]=$ | $x[i]$ | $x[i-3] \oplus x[i-4] \oplus x[i-5]$ |
| $\tilde{y}[i+1]=$ | $x[i+1]$ | $x[i-2] \oplus x[i-3] \oplus x[i-4]$ |
| $\tilde{y}[i+2]=$ | $x[i+2]$ | $x[i-1] \oplus x[i-2] \oplus x[i-3]$ |
| $\tilde{y}[i+3]=$ | $x[i+3]$ | $x[i] \oplus x[i-1] \oplus x[i-2]$ |
| $\tilde{y}[i+4]=$ | $x[i+4]$ | $x[i+1] \oplus x[i] \oplus x[i-1]$ |
| $\tilde{y}[i+5]=$ | $x[i+5]$ | $x[i+2] \oplus x[i+1] \oplus x[i]$ |
| $\tilde{y}[i+6]=$ | $x[i+6]$ | $x[i+3] \oplus x[i+2] \oplus x[i+1]$ |
| $\tilde{y}[i+7]=$ | $x[i+7]$ | $x[i+4] \oplus x[i+3] \oplus x[i+2]$ |

FIG. 8

$$\begin{cases} x[i-1] = y_0[i-1] \\ x[i] = y_0[i] \\ x[i+1] = y_1[i+4] \oplus x[i] \oplus x[i-1] \\ x[i+2] = y_1[i+5] \oplus x[i+1] \oplus x[i] \\ x[i+3] = y_1[i+6] \oplus x[i+2] \oplus x[i+1] \end{cases}$$

APPARATUS AND METHOD FOR ADAPTIVE, MULTIMODE DECODING

CROSS-REFERENCE TO RELATED APPLICATIONS

The present invention is related to H-L Lou et al., U.S. patent application Ser. No. 09/425,143, entitled "Packet Loss Control Method for Real-Time Multimedia Communications", filed Oct. 21, 1999, commonly assigned to the assignee of the present invention, and incorporated by reference herein, with priority claimed for all commonly disclosed subject matter (the "first related application").

The present invention is related to E. Martinian et al., U.S. patent application Ser. No. 09/707,686, entitled "Low Delay Channel Codes for Correcting Bursts of Lost Packets", filed Nov. 7, 2000, commonly assigned to the assignee of the present invention, and incorporated by reference herein, with priority claimed for all commonly disclosed subject matter (the "second related application").

FIELD OF THE INVENTION

The present invention relates, in general, to the field of error correcting codes for data transmission, and more specifically, to packet loss recovery and adaptive decoding of hybrid codes, optimized for both erasure bursts and random bit errors, for use in data packet-based networks providing real-time multimedia communications.

BACKGROUND OF THE INVENTION

In data packet-based networks, such as the Internet, a significant problem arises due to packet loss, with a corresponding loss of data. Because each packet is transmitted independently through the network, and potentially via different network routes, a destination location may fail to receive an occasional sequence of one of more data packets, or may receive some data packets after an atypical but substantial delay. For applications which do not require or which do not occur precisely in real-time, such as email, web browsing, or other data transfers, the occasional loss or delay of a data packet is comparatively less of a concern, and may often be simply solved through data retransmission of the lost or delayed packet.

For real-time applications, however, such as for multimedia communications, including voice communications (such as voice communication over networks using the internet protocol (IP) (VoIP)), a significant delay in receiving some data packets has the same effect as not receiving them at all, because for a communication session to proceed in real-time, the receiver typically cannot wait for delayed packets. More particularly, to avoid a potentially noticeable interruption of a communication session, with corresponding consumer dissatisfaction, the receiver cannot wait to receive delayed packets and delay the processing of currently received, but sequentially subsequent, packets.

Redundancy coding has primarily been employed to address the problem of error correction, including the packet loss problem. Packet loss is typically recognized as an erasure channel. Classical error correcting codes, such as binary block codes, convolutional codes, and Reed Solomon codes, as known in the art, may then be employed in an erasure correcting mode. In many respects, however, correcting an erasure is simpler than correcting a random bit error, to the extent that the location of an erasure is known, while the location of a random bit error may be unknown.

In the context of a loss of one or more packets during a transmission of a sequence of packets through a network, a packet loss effectively causes a continuous string (a "burst") of erased symbols. Utilizing classical channel codes designed to correct random errors or erasures, prior art methods of correcting for burst erasures have utilized a form of interleaving or permuting of bits within relatively long sequences of packets. When decoded, the burst erasure appears as a random error or erasure of one or more individual bits within a given stream of information bits, which may then be corrected. This prior art error correcting process, however, results in significant delays, due both to the interleaving at the sender and to the de-interleaving and decoding of the received data at the destination (in order to recreate the original sequence of the data). Such delay may be prohibitive for real time applications, such as voice over IP.

One reference, Schuster et al. U.S. Pat. No. 5,870,412, issued Feb. 9, 1999, entitled "Forward Error Correction System for Packet Based Real Time Media", discloses a system for encoding data packets, utilizing w+1 data packets, for recovery of up to w potentially lost or delayed packets, with a maximum decoding delay of 2w−1 packets. The first related application discloses a significant improvement over Schuster et al, diminishing recovery delay by almost two-fold, utilizing a rate ½ "duplicate and delay" methodology, in which up to w potentially lost or delayed packets also may be recovered, but with a maximum decoding delay of only w packets.

The second related application discloses an entirely new series or category of codes which are optimal for correcting a given level of burst erasures, for a given guard space, with a correspondingly optimal and lowest decoding delay. In addition, this new series of codes is multi-rate, including codes of rate ½, rate ¾, and rate ⅗, among other rates (as known in the field, the rate of a code is determined as a ratio of the number of information bits to the total number of encoding bits (the code bits utilized to encode the information bits).

Received signal quality may still be improved, however, beyond the capability of a recovery of lost or delayed data packets. For example, under conditions of minimal or negligible packet loss, for the same level of forward error correction overhead within a data packet, system resources may be more optimally allocated toward increased random bit error correction, including random erasure correction, or increased source encoding.

As a consequence, a need remains for providing multiple modes of error correction, providing for both burst erasure correction with optimally low delay, while simultaneously or alternatively providing for significant random bit error correction. As a consequence, a need remains for a multiple mode and adaptive decoder, which in the presence of packet losses may provide for burst erasure correction with optimally low delay, and under other channel conditions, simultaneously or alternatively may provide for random bit error correction and/or increased source coding.

SUMMARY OF THE INVENTION

The present invention provides for adaptive and multimode decoding, in a data packet-based communication system, to provide improved received signal quality in the presence of burst erasures, such as from lost or delayed data packets, or in the presence of random bit errors and erasures. The present invention has particular suitability for real-time, delay sensitive applications, such as voice over Internet Protocol, audio, video, other multimedia applications, or any form of data communication having a real-time delay constraint. In the presence of burst erasures, the adaptive multimode decoder of the present invention preferably utilizes a maximally short (MS) burst erasure correcting code, which has a comparatively short decoding delay, and depending upon the level of such burst erasures, different rate MS codes may be utilized. In the various alternative embodiments, other codes also may be utilized, such as hybrid or multidescriptive codes, which may correct for both a degree of burst erasures and a degree of random bit errors. When no burst erasures are detected, the adaptive multimode decoder of the present invention preferably provides for random bit error correction, to improve received signal quality. In another embodiment, when no burst erasures are detected, the present invention may utilize increased source coding or increased random bit error correction encoding, in lieu of corresponding burst erasure coding, also to improve received signal quality. For certain operating modes, the adaptive multimode decoder of the present invention operates in concert with an encoder of a corresponding data packet transmitter, to request encoding of the data packets utilizing any of the varying rate codes or varying types of codes.

The preferred apparatus embodiment for adaptive multimode decoding, for data packet-based communication, includes a state detector, a burst erasure corrector, an error corrector (such as a Viterbi or other trellis decoder), and may also include a combined burst erasure and error corrector. The state detector is operative to detect a burst erasure, and to select any of the various data outputs from among the burst erasure corrector, the error corrector, or the combined burst erasure and error corrector.

The burst erasure corrector is operative, when a detected burst erasure has a burst erasure level which is greater than a first selected threshold, to decode a plurality of received data packets utilizing a first corresponding burst erasure correction code, such as a rate ¾ maximally short burst erasure correcting code. When the detected burst erasure has a burst erasure level which is greater than a second selected threshold (the second selected threshold being greater than the first selected threshold), the burst erasure corrector is operative to decode a plurality of received data packets utilizing a second corresponding burst erasure correction code, such as a rate ½ maximally short burst erasure correcting code.

The error corrector, such as a Viterbi decoder, is also coupled to the state detector, and when a burst erasure has not been detected, the error corrector is operative to decode transmitted data packets utilizing a first corresponding random bit error correction code.

The combined erasure and error corrector, also coupled to the state detector, is operative, when the detected burst erasure has a first burst erasure level which is greater than the first selected threshold and is not greater than a second selected threshold, to decode a plurality of received data packets utilizing a multidescriptive burst erasure and bit error correction code, or utilizing a hybrid burst erasure and bit error correction code.

In the preferred embodiment, the preferred burst erasure correction codes are maximally short ("MS") codes. These MS codes are obtained from a group of MS codes having a rate R and having integer parameters m and s, in which $$R = \frac{ms+1}{ms+1+s},$$

and wherein the first corresponding burst erasure correction code has a capacity of correcting erasure bursts of s erasures relative to a guard length (g) and decoding delay (T) in which g=T=ms+1.

Numerous other advantages and features of the present invention will become readily apparent from the following detailed description of the invention and the embodiments thereof, from the claims and from the accompanying drawings.

BRIEF DESCRIPTION OF THE DRAWINGS

FIG. 2 is a diagram illustrating a sequence of encoded data packets which have been coded utilizing an exemplary, maximally short rate ½ code in accordance with the present invention.

FIG. 3 is a diagram illustrating a zero state response of an exemplary, rate ¾ maximally short (2,1) code to an information stream starting at time zero, in accordance with the present invention.

FIG. 4 is a diagram illustrating a decoding of an erasure utilizing a maximally short (2,1) code in accordance with the present invention.

FIG. 5 is a diagram illustrating a sequence of encoded data packets which have been coded utilizing an exemplary, maximally short (2,1) code, and illustrating recovery of potentially lost or delayed encoded data packets, in accordance with the present invention.

FIG. 6 is a diagram illustrating a sequence of encoded data packets which have been coded utilizing an exemplary, rate ⅗ maximally short (2,1) code, and illustrating recovery of potentially lost or delayed encoded data packets, in accordance with the present invention.

FIG. 7 is a diagram illustrating a sequence of encoded data packets which have been coded utilizing an exemplary hybrid code in accordance with the present invention.

FIG. 8 is a diagram illustrating a sequence of parity check equations for recovery of potentially lost or delayed encoded data packets, in which the encoded data packets have been coded utilizing an exemplary hybrid code in accordance with the present invention.

DETAILED DESCRIPTION OF THE INVENTION

Figure 1:
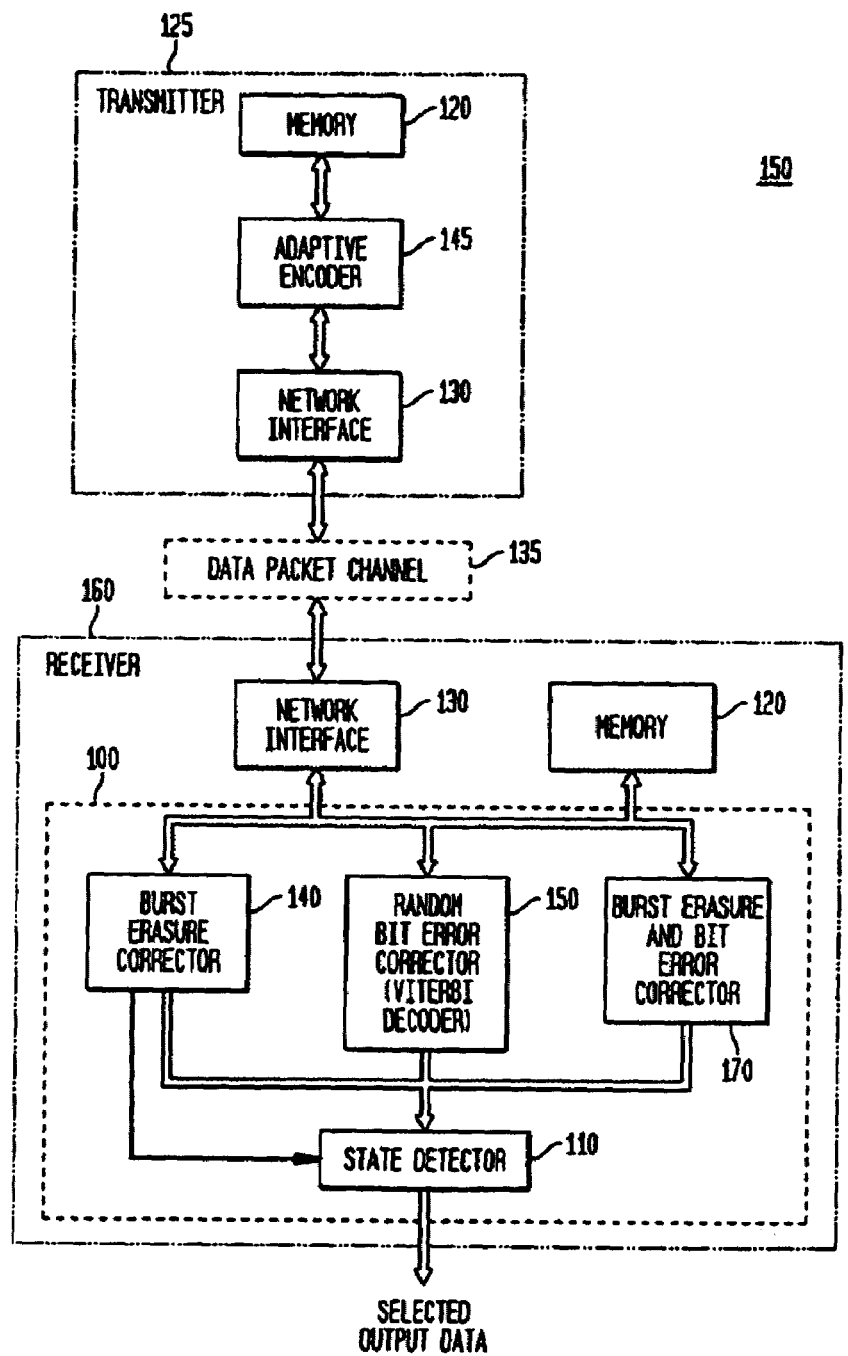
FIG. 1 is a block diagram illustrating preferred apparatus and system embodiments for adaptive, multimode decoding in accordance with the present invention.

While the present invention is susceptible of embodiment in many different forms, there are shown in the drawings and will be described herein in detail specific embodiments thereof, with the understanding that the present disclosure is to be considered as an exemplification of the principles of the invention and is not intended to limit the invention to the specific embodiments illustrated.

As mentioned above, a need remains for providing multiple modes of error correction. The present invention provides for improved received signal quality using multiple modes of erasure and bit error correction, providing for both burst erasure correction with optimally low delay, while simultaneously or alternatively providing for significant random bit error correction. The multiple mode and adaptive decoder of the present invention, in the presence of packet losses, provides for burst erasure correction with optimally low delay, and under other channel conditions, simultaneously or alternatively may provide for random bit error correction and/or increased source coding.

To illustrate the present invention, the following discussion will begin with an explanation of the notation utilized throughout the description and accompanying drawings. Following that explanation, the present invention will be explained in detail, utilizing the described notation, with particular reference to the drawings.

1. Notation

It should be noted that the data packets referred to throughout the following discussion are organized into consecutive sections. As is known in the art, an initial section containing control or header information, such as address information, forms the beginning of every data packet, and is not of concern in the present invention. The discussion of the present invention will omit further reference to such header information, and instead will focus on the next two sections of the data packet, namely, a first section containing information bits (a data payload), and a second section containing error control (check or parity) bits. For a rate ½ code, the number of check bits in the second section is equal to the number of information bits in the first section. The various channel, convolutional and hybrid codes of the present invention are applied on bits across consecutive packets, by bit position, for example, to the $i^{th}$ bit of each data packet 1 though n, for n data packets (rather than linearly within the same data packet). Decoding is similarly applied bit-wise across consecutive packets, generally using a plurality of decoders operating in parallel, one for each payload bit, with an $i^{th}$ decoder decoding the $i^{th}$ bit sequence across the n data packets. As illustrated in the various diagrams, such as in FIGS. 2 through 6 and FIG. 8, the information bits are demarcated from the check bits by a symbol comprised of a double vertical line, ‖, with the relevant bit or bits illustrated within a box.

For any symbol s, define $s^x$ as the string obtained by repeating s exactly x times (e.g., $\{00\}^2=\{0000\}$). We denote the concatenation of two strings, a and b, as a◇b (e.g., $\{01\}◇\{11\}=\{0111\}$). We use $\vec{e}=(\ldots, e_0, e_1, e_2, \ldots)$ to denote an erasure sequence where $e_i=1$ if and only if the $i^{th}$ symbol is erased.

A sequence of erasures, $e_{1+1}, e_{1+2}, \ldots e_{1+s}$, is referred to as an "erasure burst" of length s relative to a "guard space" of length g if:

1. $e_{1+1}=e_{1+s}=1$;
2. The g symbols preceding $e_{1+1}$ and the g symbols following $e_{1+s}$ are all 0's; and
3. The s symbols from $e_{1+1}$ through $e_{1+s}$ contain no subsequence of g 0's.

We will use $\vec{x}[i]$ to refer to information sequences and $\vec{y}[i]$ to refer to the corresponding encoded sequences. Let $\vec{x}[i]$ denote the information sent in symbol i. In accordance with various embodiments of the present invention, in order to achieve a k/n error correcting code, $\vec{x}[i]$ is advantageously divided into k equal units: $\vec{x}[i]=(x_1[i], x_2[i], \ldots,$ $x_k[i])$, with each unit an element of a Galois field, GF($2^r$), with r referring to the number of bits in each of the k units. Standard rules of finite field arithmetic are utilized, fully familiar to those of ordinary skill in the art, with ⊕ denoting addition in the finite field GF($2^r$) (such that with r=1, ⊕ denotes (bit-wise) modulo 2 addition, or with r=2, ⊕ denotes modulo 4 addition), and with denoting multiplication. We shall use D to denote the delay operator. Thus, an information sequence consisting of 2 non-zero symbols at time 0 and time 1, with all other symbols being zero, may be written as:

$$\vec{x}(D)=(x_0[0], x_1[0], \ldots, x_k[0])+x_0[1], (x_1[2], \ldots, x_k[0],)D$$

Similarly, the coded sequence for a corresponding repetition code may be written as:

$$\vec{y}(D)=(\vec{x}[0], \vec{x}[-1]+\vec{x}[1], \vec{x}[0])D+\vec{x}[2], \vec{x}[1]/D^2$$

Lastly, as known in the art, reference to distances or free distances herein shall be, respectively, Hamming distances or free Hamming distances.

2. Multimode Decoding and Hybrid Codes

There are large classes of potential channels which qualify as burst erasure channels and various metrics may be appropriate to characterize the quality of a given forward error correcting ("FEC") code for a general channel. As one generally useful criterion, and as used herein, error correcting codes are evaluated based upon the longest erasure burst which may be corrected by the given code, for a given delay, for a given level of overhead (or rate), and for a given guard space. Additionally, another criterion utilized is received signal quality, which also includes the degree to which the error correcting code may correct for random bit errors (or erasures) within a received packet, particularly when the rate of packet loss or delay is minimal or negligible.

It should be noted that, as used herein, "random bit errors" refers to not only to erroneous bits (such as a 0 occurring instead of a 1 or vice-versa), but also to random bit erasures (such as an undetected or an ambiguous symbol occurring in place of a 0 or 1). It should also be noted that the burst erasure correction and random bit error correction of the present invention may be combined with or applied independently from other forms of error mitigation, which also may be utilized, such as error mitigation through various forms of estimation or prediction of the bits which may have occurred in a lost data packet based upon previously received data packets.

FIG. 1 is a block diagram illustrating preferred adaptive, multimode decoder apparatus 100 and system 150 embodiments for adaptive, multimode decoding in accordance with the present invention. In the preferred embodiment, such an apparatus 100 may be included within any receiver (or transceiver) 160, of any kind, within a communication system 150, such as a computer, a decoder, a modem, a data transceiver, or included within any multimedia or other communication device utilized with any data packet-based communication systems. (Numerous other variations and equivalent embodiments will be readily apparent and are also within the scope of the present invention).

Referring to FIG. 1, the system 150 includes a data transmitter (or transceiver) 125 and a data receiver 160 (which includes an adaptive multimode decoder 100 of the present invention), which are coupled or linked for communication with each other (through corresponding network interfaces 130) over a data packet channel 135, such as the Internet. Such a channel 135 may occur in any form or any medium, of any kind, as may be known or become known in the art, such as wireless, wireline, coaxial cable, fiber optic, and so on. As mentioned above, such a data packet channel 135 may be subject to or may create data packet loss or delay, or other data transmission errors, and in general, may be considered a burst erasure channel. For purposes of the present invention, the data transmitter 125, in addition to a memory 120 and network interface 130, preferably includes a variable or adaptive encoder 145, which may respond to requests or other directives from the adaptive, multimode decoder apparatus 100 to, for example, adjust the data encoding rates for channel encoding and/or source encoding, as discussed in greater detail below.

Also for purposes of the present invention, the data receiver 160, in addition to a memory 120 and network interface 130, includes an adaptive multimode decoder 100. The network interfaces 130 of the receiver 160 and transmitter 125, respectively, are utilized to receive and to transmit data packets, messages and other signals of the various communication links (legs or paths), in accordance with any applicable protocols, such as IP or TCP/IP, or any applicable form of modulation, such as quadrature amplitude modulation (QAM) or pulse amplitude modulation (PAM). Various functions of the adaptive multimode decoder 100 of the present invention are preferably implemented or otherwise included within a processor as discussed below, but also may be included or distributed equivalently within other data receiver 160 components, as will be apparent to those of skill in the art. Each memory 120 of a respective receiver 160 or transmitter 125 may be any type of memory integrated circuit, such as RAM, FLASH, DRAM, SRAM, MRAM, FeRAM, ROM, EPROM or $E^2PROM$, or any other type of memory or data storage apparatus or circuit, depending upon the selected embodiment, such as a magnetic hard drive or an optical storage device. The memory 120 is used to store information pertaining to encoding or decoding, as the case may be, and as discussed in greater detail below. For example, when included within a receiver 160, the memory 120 may store information pertaining to recovery of erased data packets, or in other modes, information pertaining to Viterbi or other trellis decoding.

The adaptive multimode decoder 100, in the preferred embodiment, includes a state detector 110, a burst erasure detector and corrector 140 (referred to herein more simply as a burst erasure corrector 140), and an error corrector (or random bit error detector and corrector) 150 (such as a Viterbi decoder). Optionally, the decoder 100 may also include a combined burst erasure and random bit error corrector 170 which, when operational, may perform the combined functions of the burst erasure corrector 140, and error corrector 150. In addition, as another option, the state detector 110 may also be implemented between the network interface 130 and the various correctors 140, 150 and 170, rather than in the location illustrated in FIG. 1. As indicated above, the adaptive multimode decoder 100 operates bitwise across data packets, on each successive $i^{th}$ bit of consecutive or sequential data packets, with decoding occurring in parallel for each bit within a given data packet (i.e., the decoder 100 may be viewed conceptually to include n decoders operating in parallel to decode n payload bits of a data packet).

Continuing to refer to FIG. 1, the adaptive multimode decoder 100 (including its components 110, 140, 150 and 170) is preferably implemented in the form of a processor, as the term processor is used herein, such that this implementation may include a single integrated circuit ("IC"), or may include a plurality of integrated circuits or other components connected, arranged or grouped together, such as microprocessors, digital signal processors ("DSPs"), custom ICs, application specific integrated circuits ("ASICs"), field programmable gate arrays ("FPGAs"), associated memory (such as RAM and ROM), and other ICs and components. As a consequence, as used herein, the term processor should be understood to equivalently mean and include a single IC, or arrangement of custom ICs, ASICs, processors, microprocessors, controllers, FPGAs, or some other grouping of integrated circuits which perform the functions discussed below, with associated memory, such as microprocessor memory or additional RAM, DRAM, SRAM, MRAM, ROM, EPROM or $E^2PROM$. The adaptive multimode decoder 100, when implemented as such a processor with its associated memory, may be configured (via programming, FPGA interconnection, or hard-wiring) to perform the methodology of the invention, as discussed below. For example, the methodology may be programmed and stored, in a processor with its associated memory (and/or memory 120) and other equivalent components, as a set of program instructions (or equivalent configuration or other program) for subsequent execution when the processor is operative (i.e., powered on and functioning). Equivalently, when the adaptive multimode decoder 100 are implemented in whole or part as FPGAs, custom ICs and/or ASICs, the FPGAs, custom ICs or ASICs also may be designed, configured and/or hard-wired to implement the methodology of the invention. In the preferred embodiment, the adaptive multimode decoder 100 is implemented as an arrangement of microprocessors, DSPs and/or ASICs, collectively referred to as a "processor", which are respectively programmed, designed or configured to implement the methodology of the invention.

The operation of the apparatus 100 and system 150 illustrated in FIG. 1 may now be briefly explained. Data packets received through the network interface 130 of the adaptive multimode decoder 100 are input into the burst erasure corrector 140, the error corrector 150, and optionally also into the combined burst erasure and random bit error corrector 170. In the preferred embodiment, these three corrector components 140, 150 and 170 are operated in parallel during data reception, and operate in addition to other forms of error mitigation. In the presence of burst erasures, the burst erasure corrector detects and recovers lost or delayed data packets, and provides an output stream of burst erasure corrected data packets, up to the correcting capabilities of the code utilized, as discussed below. The error corrector 150 is utilized to correct random bit errors (or erasures) which may have occurred within and among a stream of data packets, and provides an output of error corrected, sequential data packets. The error corrector 150 alternatively may be utilized to flag or signal the occurrence of random bit errors (or erasures), which may have occurred within and among a stream of data packets, without providing correction. The presence of burst erasures, however, would typically interfere with proper and accurate functioning of a random bit error corrector 150, such as a Viterbi decoder; as a consequence, the output of such an error corrector 150 is utilized only when no significant burst erasures have occurred, and when the decoding delay of such an error corrector 150 is within acceptable limits. The combined burst erasure and error corrector 170 may be utilized for decoding of the multidescriptive and/or hybrid codes discussed in greater detail below, or also may also simply be utilized to flag or detect the existence of either of these types of errors (burst erasures or random bit errors).

In accordance with the preferred embodiment, to advantageously avoid undue complexity, such as the number of computational cycles and the amount of needed hardware, the burst erasure corrector 140 is utilized whenever burst erasures are occurring, with the random bit error corrector 150 utilized either when burst erasures are not occurring or when potential decoding delay does not have significant or paramount importance. For example, use of the random bit error corrector 150, such as a Viterbi decoder, may provide excessive delay for VoIP applications, and may be used to merely flag the occurrence of bit errors. Conversely, the random bit error corrector 150 may be suitable for providing random bit error corrected output data for less delay sensitive applications, such as video or audio downloads.

During data transmission and reception, the state detector 110 of the adaptive multimode decoder 100 detects the occurrence or levels of erasure bursts or random bit errors which may have occurred. Based upon this determination, and utilizing a mechanism such as a switch, a selector, a multiplexer or an equivalent means, the state detector 110 selects which output data packets will be utilized, namely: (1) in the presence of burst erasures, the state detector 110 provides a burst erasure mode and selects a stream of burst erasure corrected data packets from burst erasure corrector 140 as the output of the adaptive multimode decoder 100; (2) when (significant) burst erasures are not occurring, the state detector 110 provides an error correction mode and selects a stream of error corrected data packets from error corrector 150 as the output of the adaptive multimode decoder 100; or (3) depending upon the encoding utilized, the state detector 110 provides a combined burst erasure and error correction mode and selects a stream of burst erasure and error corrected data packets from combined burst erasure and error corrector 170 as the output of the adaptive multimode decoder 100. (It should also be noted that if or when the state detector is implemented in between the network interface 130 and the three corrector components 140, 150 and 170, these three components then may be operated selectively, rather than in parallel, with the state detector 110 routing received encoded information to the appropriate corrector.)

In the preferred embodiment, the state detector 110 also performs an additional function of communicating with the variable or adaptive encoder 145 of the transmitter 125, to provide additional levels of adaptation for multi-rate capability, such as a determination of an optimal code rate for use in encoding by the transmitter 125, in light of the received burst erasure or bit error levels as determined by the state detector 110. For example, and as discussed in greater detail below (such as with reference to FIG. 9), the state detector 110 may determine that no burst erasures are occurring, and therefore may communicate with the variable or adaptive encoder 145 of the transmitter 125 and request that the encoder 145 of transmitter 125 use the bits available in a data packet for increased source coding or increased error correction coding, rather than for burst erasure coding, to produce improved received signal quality. Also for example, the state detector 110 may determine that a first, moderate level of burst erasures are occurring, and therefore may communicate with the variable or adaptive encoder 145 of the transmitter 125 and request that the variable encoder 145 utilize a first level of burst erasure coding, such as a rate ¾ maximally short burst erasure code (discussed below), with a corresponding level of source coding, to avoid any significant deterioration in and maintain a reasonable level of received signal quality. Continuing with the example, the state detector 110 may determine that a second, more significant level of burst erasures are occurring, and therefore may communicate with the variable or adaptive encoder 145 of the transmitter 125 and request that the encoder 145 utilize a second level of burst erasure coding, such as a rate ½ maximally short burst erasure code (discussed below), or a multidescriptive or hybrid channel code, also with comparatively decreased, corresponding level of source coding, to avoid any further deterioration in and continue to maintain a reasonable level of received signal quality.

The operation of the apparatus 100 and system 150 illustrated in FIG. 1 is also discussed in greater detail below, following the discussion of the various codes, with reference to FIGS. 2 through 8, and in particular with regard to the methodology of adaptive and multimode encoding and decoding, with reference to FIGS. 9 and 10.

FIG. 2 is a diagram illustrating a sequence of encoded data packets which have been coded utilizing an exemplary, maximally short ("MS") rate ½ burst erasure code in accordance with the present invention, and in accordance with the invention disclosed in the first related application. Referring to FIG. 2, it may be observed that the exemplary rate ½ code illustrated may correct for a burst erasure of up to three packets with a maximum delay of three packets. For example, if symbols $\vec{y}[i+1]$, $\vec{y}[i+2]$, and $\vec{y}[i+3]$ are lost due to a burst of length 3, the corresponding information symbols can be recovered once $\vec{y}[i+4]$, $\vec{y}[i+5]$, and $\vec{y}[i+6]$ are received (illustrating a delay of 3 packets), as the information bits of the lost packets are duplicated as the check bits of corresponding, subsequent packets. It will be apparent to those of skill in the art that the "duplicate and delay" methodology of FIG. 2 may be extended to recovery of a burst of up to w packets for a corresponding delay of up to w packets.

The second related application discloses a category of codes which are optimal, and indeed the best possible, for correcting for a given level of erasure burst, for a given level of delay and a given guard space (a string of bits without erasures following immediately after the erasure burst). These codes are referred to herein as maximally short ("MS"), as they are capable of providing burst erasure correction in which the guard space and the decoding delay are as short as possible.

As illustrated in the second related application, the rates R for the maximally short codes have the form $$R = \frac{ms+1}{ms+1+s},$$

in which m and s are integer parameters, and as a consequence, the maximally short codes are referred to with the parameters as MS(m,s). These codes are capable of correcting bursts of s erasures relative to a guard length (g) and decoding delay (T) in which g=T=ms+1. In addition, the second related application discloses a periodic interleaving technique, which corresponds to upsampling, in which interleaving (upsampling) by a factor of λ converts an s burst erasure correcting code with a guard length g and decoding delay T into a code which corrects bursts of λs erasures with guard length λg and decoding delay λT. Lastly, the second related application also illustrates two lower bounds on decoding delay and guard space for a rate R code:

$$\frac{T}{s} \geq \max\left(1, \frac{R}{1-R}\right), \text{ and } \frac{g}{s} \geq \left(\frac{R}{1-R}\right).$$

These bounds represent lower limits for the best possible codes; given code construction in accordance with the present invention which achieves these lower bounds with equality, the codes are optimal in terms of minimizing decoding delay and guard space and, therefore, are referred to as maximally short.

For encoding applications, a zero state response ("ZSR") of an encoder is the output of the encoder when it starts in an all zero (0) state. A code may also be completely specified by using the zero state response to an input which is non-zero only at time zero (0) ($ZSR_0$). FIG. 3 is a diagram illustrating a ZSR of an exemplary, rate ¾ maximally short (2,1) code to an information stream starting at time zero, in accordance with the present invention. This MS(2,1) code can correct a burst of one erasure with a guard space and decoding delay of 3, as illustrated in greater detail in FIG. 4.

FIG. 4 is a diagram illustrating a decoding of an erasure utilizing a maximally short (2,1) code in accordance with the present invention. Utilizing the encoding sequence illustrated in FIG. 4, in which the symbol $\vec{y}[4]$ has been erased, $\vec{x}[4]$ may be recovered by the decoder when $\vec{y}[5]$, $\vec{y}[6]$, and $\vec{y}[7]$ have been received. The erased symbols can be recovered by inverting the parity check equations illustrated in FIG. 4, namely:

$x_0[4]=y_4[5]\oplus(-x_1[3])\oplus(-x_2[2])$ $x_1[4]=y_4[6]\oplus(-x_0[5])\oplus(-x_2[3])$ $x_2[4]=y_4[7]\oplus(-x_1[6])\oplus(-x_1[5])$.

To achieve a greater level of burst error correction, the MS(2,1) code of FIGS. 3 and 4, and other codes of the present invention, the present invention employs the technique of periodic interleaving, which corresponds to upsampling by a given factor, referred to herein as λ, as mentioned above. FIG. 5 is a diagram illustrating a sequence of encoded data packets which have been coded utilizing an exemplary, maximally short (2,1) code, utilizing upsampling of λ=2, and illustrating recovery of potentially lost or delayed encoded data packets, in accordance with the present invention. As illustrated in FIG. 5, if a burst of two erasures starts at time t=6, the erased symbols may be recovered in a manner similar to the example of FIG. 4. The decoding delay and guard space required for the upsampled code are twice that required for the base code. As a consequence, the upsampled code is a rate ¾ code with g/s=T/s=6/2=3, meeting the bounds mentioned above with equality.

In general, MS(m,1) codes of rate $$R = \frac{m+1}{m+2}$$

can be constructed for any value of m≧0 using single parity check codes similar to the rate ¾ example. It will be apparent to those of skill in the art that these codes have a decoding delay T=m+1, and will require a guard space of g=m+1. Such codes advantageously meet the optimality criteria of the present invention. These codes meet the bounds for guard space and decoding delay and, moreover, advantageously can be upsampled by any multiple λ=s to produce codes which correct erasure bursts of length s for any s≧1.

In addition, advantageous properties of the rate ¾ MS(2,1) code discussed above should be noted. This MS(2,1) code is based upon a (4,3) single parity check ("SPC") block code, familiar to those of skill in the art. Referring to FIG. 3, the parity check symbols are not computed on "rows" or "columns" of symbols, but rather are advantageously computed on "diagonals" of symbols.

In accordance with the present invention, to generalize codes, such as the MS(2,1) code, to other rates, the idea of using block codes computed across packets of various information symbols is maintained; however, maximum distance separable ("MDS") block codes are implemented, rather than SPC block codes. More specifically, let C be a systematic, (n,k,d)=(6,4,3) block code; those of skill in the art will recognize that a (6,4,3) MDS code can be constructed by first constructing an (8,4,5) systematic Reed-Solomon code over $GF(2^3)$ and then puncturing the last two parity check symbols. The two parity check symbols of C corresponding to the four information symbols ($x_0$, $x_1$, $x_2$, $x_3$) are denoted as $P\{x_0, x_1, X_2, X_3\}$.

For creating a rate ⅗ code, the $ZSR_0$ for a rate ⅗, MS(1,2) code is $$\vec{y}(D) = (x_0[0], x_1[0], x_2[0], 0, 0) +$$
$$(0, 0, 0, P\{x_0[0], 0, 0, 0\})D +$$
$$(0, 0, 0, P\{0, x_0[0], 0, 0\})D^2 +$$
$$(0, 0, 0, P\{0, 0, x_1[0], x_2[0]\})D^3$$

FIG. 6 is a diagram illustrating a sequence of encoded data packets which have been coded utilizing this exemplary, rate ⅗ maximally short (2,1) code (having the $ZSR_0$ discussed immediately above), and further illustrating recovery of potentially lost or delayed encoded data packets, from a 2 erasure burst, in accordance with the present invention. As illustrated, an erasure burst has erased the coded symbols $\vec{y}[3]$ and $\vec{y}[4]$. In accordance with the present invention, the decoder waits until $\vec{y}[5]$ is received and then uses the decoding algorithm for C to recover $x_0[3]$ and $x_0[4]$ from $y_{3,4}[5]=P\{x_0[4], x_0[3], x_1[2], x_2[2]\}$. Since C has minimum distance 3 and for purposes of illustration herein we have assumed that neither $x_1[2]$ nor $x_2[2]$ were erased, $x_0[3]$ and $x_0[4]$ can be successfully recovered. Next, the decoder receives $\vec{y}[6]$, and then advantageously uses it to decode $x_{1,2}[3]$ from $y_{3,4}[6]=P\{x_0[5], x_0[4], x_1[3], x_2[3]\}$. Since $x_0[4]$ was recovered at the previous step and $x_0[5]$ was not erased, $x_{1,2}[3]$ can be successfully recovered. Lastly, when the decoder receives $\vec{y}[7]$, $x_{1,2}[4]$ can be successfully recovered from $y_{3,4}[7]=P\{x_0[6], x_0[5], x_1[4], x_2[4]\}$ given that neither $x_0[5]$ nor $x_0[6]$ were erased.

Examining FIG. 6, it is apparent that for an erasure burst of length 2 starting at time t, the illustrative decoding of the present invention requires that symbols t+2, t+3, and t−1 not be erased. As a consequence, the guard space may be seen to be g=2, with a decoding delay of T=2 and, again, meeting the optimality criteria for a maximally short code in accordance with the present invention.

In addition, in accordance with another advantageous feature of the present invention, the MS(1,2) code may be upsampled, analogously to the previous examples. In particular, the MS(1,2) code may be upsampled by k to obtain a rate ⅗ code which corrects erasure bursts of length $s\lambda$ relative to a guard space of $g\lambda$ with a decoding delay of $T\lambda$, creating an upsampled code which is also maximally short.

The second related application should be consulted for further examples of maximally short codes, and in particular, various methodologies for generalizing such codes (such as with reference to FIG. 7 of the second related application).

FIG. 7 is a diagram illustrating a sequence of encoded data packets which have been coded utilizing an exemplary hybrid code in accordance with the present invention. FIG. 8 is a diagram illustrating a sequence of parity check equations for recovery of potentially lost or delayed encoded data packets, in which the encoded data packets have been coded utilizing an exemplary hybrid code (illustrated in FIG. 7) in accordance with the present invention.

The code illustrated in FIG. 7, in accordance with the present invention, is referred to as a hybrid code, as it provides greater robustness for both burst erasures and random errors (or random erasures). For example, while the code illustrated in FIG. 2 may correct all bursts of length 3 (with a corresponding decoding delay), it is unable to recover from isolated, two erasure patterns, such as where symbol i and symbol i+3 are erased. FIG. 7 illustrates an encoded sequence for a hybrid code which can correct a burst of 3 erasures, with a decoding delay of 3, as in the code of FIG. 2, but has a greater free distance (4 compared to 3), and is therefore comparatively more robust to random errors and erasures when a longer decoding delay is permissible.

For example, if symbols $\vec{y}[i+1]$, $\vec{y}[i+2]$, and $\vec{y}[i+3]$ are lost due to a burst of length 3, the corresponding information symbols can be recovered once $\vec{y}[i+4]$, $\vec{y}[i+5]$, and $\vec{y}[i+6]$ are received, by solving the parity check equations illustrated in FIG. 8. As a consequence, $x[i+j]$ is recovered when $\vec{y}[i+j+3]$ is received, for $j \in \{1, 2, 3\}$, resulting in a decoding delay of 3. Further analysis by those of skill in the art will also disclose that the hybrid code of FIG. 7 has a free distance of 4, and can therefore correct any 3 erasure pattern, with sufficient decoding delay. In addition, this hybrid code can provide symbol recovery from longer bursts, such as bursts of length 4 or 5, provided a greater decoding delay, such as 8 and 9, respectively, and may further always correct one random error, again, when provided with sufficient decoding delay. Those of skill in the art will recognize that the hybrid code illustrated in FIG. 7 may be generalized to correct all bursts of length w with decoding delay of w, while having a free distance of 4.

This hybrid code is particularly useful in applications where a short average delay is required or advisable, rather than a short maximum delay. For example, the multimode decoder of the present invention may be employed in a first mode which decodes with a decoding delay of 3 when possible (e.g., when erasure bursts ≦3 occur), and in a second mode, with greater robustness for burst erasure and random error correction, with longer decoding delays, as indicated by corresponding circumstances (such as burst erasures of length greater than 3). Such an example may occur in speech decoding applications, such as decreasing the playback rate of speech when longer decoding delays are needed, followed by subsequently speeding up the speech or removing silent periods to reduce the perceived delay back to acceptable levels.

With this background of maximally short codes and hybrid codes, the features of the present invention may be addressed in greater detail. In particular, a goal of the present invention is to optimize perceived signal quality at the receiver, such as at the listener of a VoIP communication, depending upon channel conditions. In accordance with the present invention, the adaptive multimode decoder 100 at the receiver 160, as illustrated in FIG. 1, potentially in concert with the encoder 145 of the transmitter 125 of the data packets, may adapt to potentially changing channel conditions of the data packet channel 135. For example, burst erasure code rates, such as the various rates of the maximally short codes of the present invention, may be changed or adjusted based upon the degree, if any, of erasures occurring in the communication session. In addition, also depending upon the degree, if any, of erasures occurring in the communication session, for a fixed capacity communication link, more or less of the available bits for transmission within the data packet may be allocated for correspondingly increased or decreased random bit error correction or source coding, with correspondingly less or more bits allocated for burst erasure coding, utilizing the maximally short, multidescriptive or hybrid codes in accordance with the present invention. (It should be noted that for a fixed capacity link, adding (or decreasing) redundancy in the form of an erasure correcting code decreases (or increases) the bits available for other forms of coding, such as random bit error correction coding or source coding). It should also be noted that, as used herein, "multidescriptive" refers to the use of two or more non-identical, coordinated types of encoding, as discussed in greater detail in the first related application.

Figure 9:
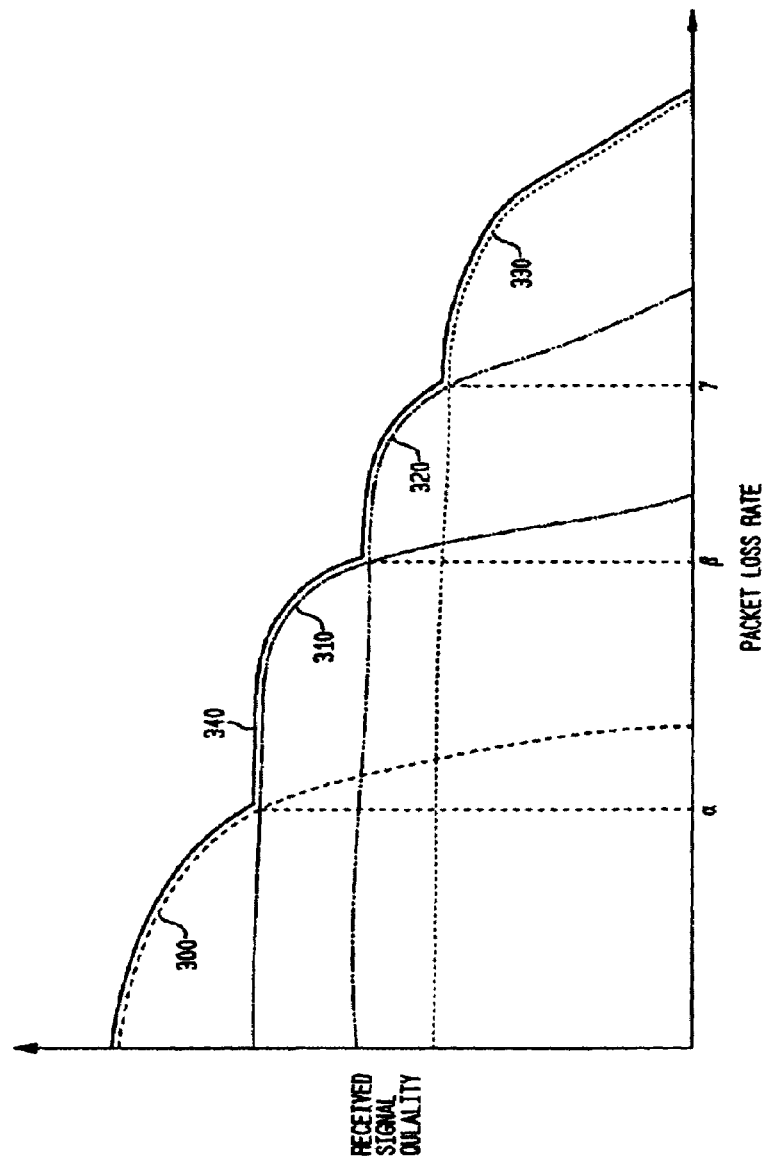
FIG. 9 is a graphical diagram illustrating coding level adaptation in accordance with the present invention.

FIG. 9 is a graphical diagram illustrating coding level adaptation in accordance with the present invention. As indicated above, the adaptive coding and decoding of the present invention assumes the presence of a fixed capacity, bursty erasure channel (as the converse of a limitless capacity channel, if available, would allow effectively unlimited resources for burst erasure correcting, random bit error correcting, and source coding). Conceptually, for a channel with virtually no erasures, little or no burst erasure coding need be utilized, with resources reserved for increased source coding or increased random bit error correction coding, resulting in improved signal quality at the receiver, illustrated in FIG. 9 as (dashed) line 300. In the presence of erasures or other packet losses, illustrated as a packet loss rate of $\alpha$ in FIG. 9, however, received signal quality (as a performance measure) diminishes rapidly when no burst erasure coding is utilized and only random bit error correcting or source coding is utilized. As packet loss may increase, as a consequence and in accordance with the present invention, a relatively high rate (such as rate ¾) burst erasure code improves performance, with fewer resources allocated to random bit error correction or source coding, illustrated in FIG. 9 as (dot-dashed) line 310.

In the presence of a greater level of erasures or other packet losses, illustrated as a packet loss rate of $\beta$ in FIG. 9, however, received signal quality also diminishes rapidly when a comparatively high rate burst erasure code is utilized, such as a rate ¾ code. As the packet loss rate further increases, as a consequence and also in accordance with the present invention, a relatively lower rate burst erasure code (such as the hybrid code of FIG. 7) improves performance, having greater robustness to erasures (compared to no channel coding (300) or a higher rate burst erasure code (310)), and again with even fewer resources allocated to other forms of encoding, such as random bit error correction or source coding, illustrated in FIG. 9 as (double dotted and dashed) line 320. In the presence of a greater level of erasures or other packet losses, illustrated as a packet loss rate of γ in FIG. 9, however, received signal quality also diminishes rapidly when a comparatively high rate channel coding is utilized, such as a hybrid code. As the packet loss rate further increases, as a consequence and also in accordance with the present invention, a relatively lower rate channel code (such as the rate ½ code of FIG. 2) improves performance, having greater robustness to erasures (compared to no burst erasure coding (300), to a higher rate burst erasure code (310), or to a hybrid code (320)), and again with even fewer resources allocated to other forms of coding, illustrated in FIG. 9 as (dotted) line 330. (As illustrated in FIG. 9, the signal quality as a function of packet loss rate and levels of burst erasure or other coding may also be shown to be the case empirically, with good reliability.)

Continuing to refer to FIG. 9, in accordance with the present invention, an adaptive multimode decoder 100, such as illustrated in FIG. 1, it utilized to optimize received signal quality as a function of packet loss rate. Such adaptation, as a function of packet loss rate, is illustrated in FIG. 9 as (solid) line 330. As mentioned above, the state detector 110 of the adaptive multimode decoder 100 is utilized to detect the levels, if any, of burst erasures (packet loss) and random bit errors. If and when these erasure or error levels change, in the preferred embodiment, the state detector 110 communicates with the adaptive encoder 145 of the transmitter 125 to (preferably jointly) adjust the encoding scheme to accommodate current channel conditions, resulting in an improved received signal quality or avoiding an unreasonably diminished received signal quality. Alternatively, without involvement of the transmitter 125, the state detector 110 may be utilized to switch between or among a burst error correcting mode (using burst erasure corrector 140), a random bit error correcting mode (using random bit error corrector 150), or a combined mode (using combined burst erasure and error corrector 170), if and when it detects a corresponding change in the level of burst erasures or random bit errors that may be occurring, and so on. In addition, the state detector 110 selects a corresponding output from the adaptive multimode decoder 100, such as selecting the output of the error corrector Viterbi decoder) 150 when only random bit error decoding is to be utilized, selecting the output of the erasure corrector 140 when burst erasure decoding (such as the MS coding) is to be utilized, or selecting the output of the combined erasure and error corrector 170 when multidescriptive or hybrid coding is to be utilized. (Those of skill in the art will recognize that, for a variable or multi-rate application involving the transmitter 125, in order to establish an initial encoding scheme at the commencement of a communication session, testing, probing or other types of data packets may be transmitted, such as part of a "handshaking" or other training procedure, for the adaptive multimode decoder 100 to determine any initial channel conditions, and to communicate with the adaptive encoder 145 to determine the initial encoding scheme, such as a rate ¾ MS code or source coding only, for example.)

More particularly, as a packet loss rate increases (such as to level α), the adaptive multimode decoder 100 of the present invention, preferably in concert with a corresponding encoder 145 at the transmitter 125 for a variable rate implementation (as mentioned above), shifts from random bit error correction decoding only (such as Viterbi decoding in error corrector 150) to burst erasure correction decoding (in error corrector 140) using a comparatively higher rate, maximally short code, such as the rate ¾ code discussed above. As a packet loss rate increases further (such as to level β or γ), the adaptive decoder of the present invention, also preferably in concert with a corresponding encoder 145 at the transmitter 125, shifts from the comparatively higher rate, maximally short burst erasure correcting code, such as the rate ¾ code, to a comparatively lower rate, maximally short burst erasure correcting code, such as the rate ½ code discussed above, or to a rate ½ multidescriptive or hybrid code (for both random error and burst erasure correction). Conversely, as the rate of burst erasures diminishes, the adaptive multimode decoder 100, also preferably in concert with a corresponding encoder 145 at the transmitter 125, shifts from the comparatively lower rate, maximally short burst erasure correcting code, such as the rate ½ MS code, to a comparatively higher rate, maximally short burst erasure correcting code, such as the rate ¾ code discussed above, or to a multidescriptive or hybrid code, or to random bit error correction coding only. Also in accordance with the present invention, multidescriptive and/or hybrid codes may also be utilized in this adaptive manner, providing both robustness to burst erasures and, to varying degrees, robustness to random bit errors and erasures.

In addition, adaptation may also be utilized to select various codes, and corresponding decoding, as a function of the erasure pattern which may be occurring, for example, for thin bursts of 1 or 2 erased packets, compared to larger bursts of 3 or more packets. Erasure burst correction codes may also be selected based upon any needed guard space, for example, when erased packets are sequential or close in time, with few or no intervening received packets, compared to spaced apart in time with many intervening, received packets.

Figure 10:
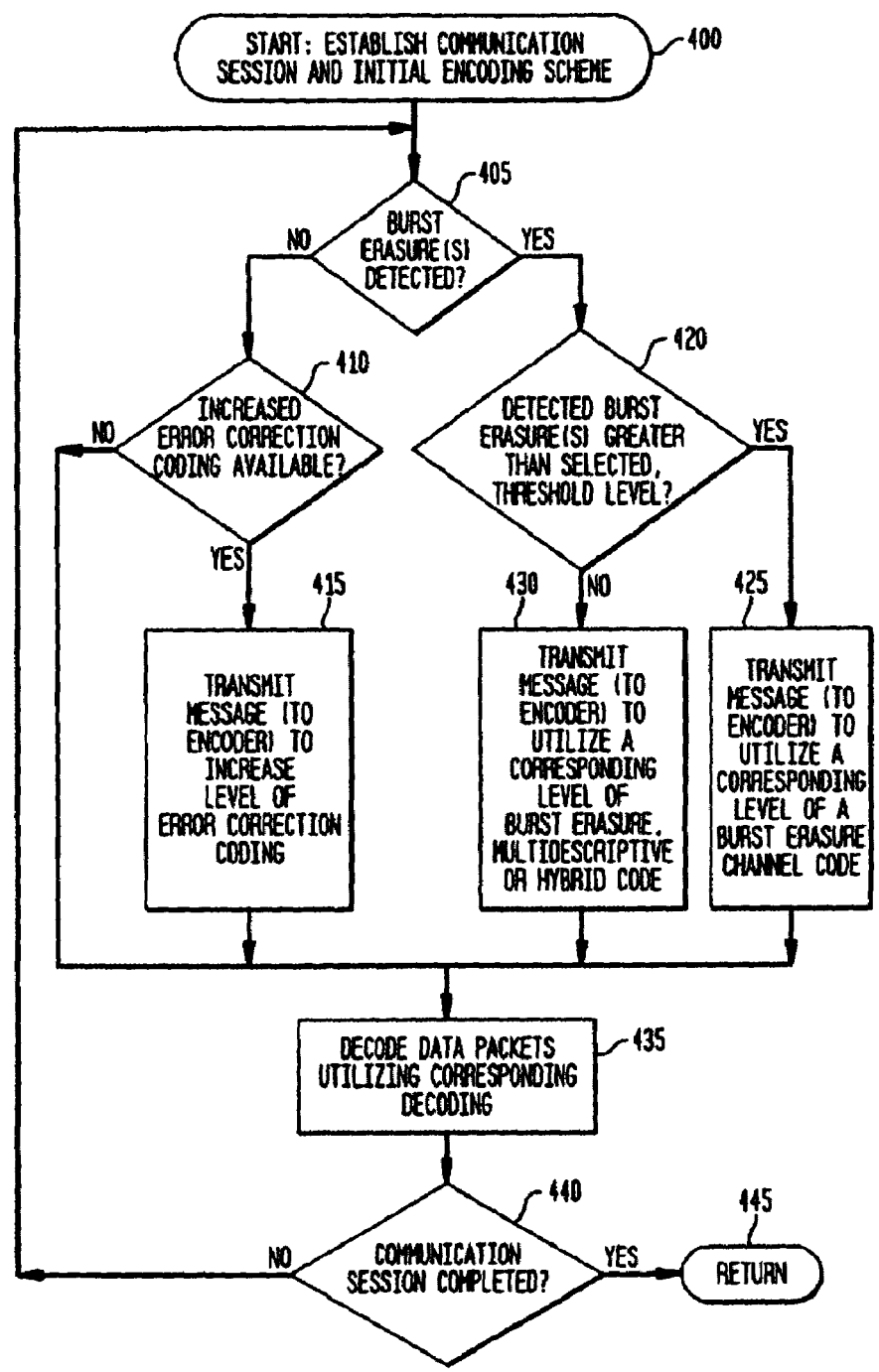
FIG. 10 is a flow diagram illustrating a preferred method in accordance with the present invention

FIG. 10 is a flow diagram illustrating a preferred method in accordance with the present invention, and provides a useful summary. It should be noted that the illustrated methodology may be simplified when embodied only within a receiver 160; for such an embodiment, steps involving message transmission to an encoder 145 (steps 415, 425 and 430), or other steps involving a changing rate or form of encoding, may be eliminated.

Beginning with start step 400, a data packet-based communication session is established, with a determination of an initial encoding scheme to be utilized. For example, the state detector 110 of the adaptive multimode decoder 100 may determine that burst erasure correction is required or advisable, such as a rate ¾ or rate ½ MS burst erasure code, or may determine that only random bit error correction source coding is needed, or may determine that a combined, multidescriptive or hybrid encoding scheme should be utilized. Following this determination, as data packets are transmitted and received, the method determines whether any burst erasures are detected, step 405, preferably by the state detector 110. When burst erasures have not been detected in step 405, the method (also preferably by the state detector 110) determines whether increased levels of random bit error correction or source coding are available, step 410, and if so, transmits a message to the encoder of the transmitter to increase the level of random bit error correction or source coding, step 415. Following step 415, or when increased levels of random bit error correction or source coding are not available in step 410, the method proceeds to step 435, and decodes transmitted data packets utilizing the corresponding decoding scheme, such as utilizing the error corrector 150 for a corresponding level of Viterbi decoding for random bit error correction. It should be noted, with regard to step 435, depending upon the outcome of the various decision steps, such as steps 405, 410 (and 420, discussed below), there may or may not be a change of types or degrees of decoding in step 435 from the type or degree of decoding previously used by the adaptive multimode decoder 100.

Continuing to refer to FIG. 10, when burst erasures have been detected in step 405, the method (also preferably by the state detector 110) determines whether the level of burst erasures detected is above a selected (or predetermined) threshold level, step 420, in order to determine an appropriate level of burst erasure correction encoding. When the level of burst erasures detected is above the selected threshold level in step 420, indicating that a comparatively more robust level of burst erasure correction encoding should be utilized, the adaptive multimode decoder 100 transmits a message to the encoder of the transmitter to increase the level of burst erasure correction coding, if available, step 425. For example, the adaptive multimode decoder 100 may transmit a message to the encoder of the transmitter to increase the level of burst erasure correction coding from a rate ¾ MS code to a rate ½ MS code or, if already using a rate ½ MS burst erasure correction code, may not transmit any message or may transmit a message to maintain the current level of burst erasure correction encoding. Following step 425, the method proceeds to step 435, and decodes transmitted data packets utilizing the corresponding decoding scheme, such as utilizing the burst erasure corrector 140 for a corresponding level of burst erasure correction and decoding. As mentioned above, with regard to step 435, depending upon the outcome of the various decision steps, and depending upon the encoding scheme currently being used, there may or may not be a change of types or degrees of decoding in step 435 from the type or degree of decoding previously used by the adaptive multimode decoder 100.

When the level of burst erasures detected is not above the selected threshold level in step 420, indicating that a comparatively more robust level of burst erasure correction encoding should not be utilized, the adaptive multimode decoder 100 transmits a message to the encoder of the transmitter to maintain or decrease the level of burst erasure correction coding, if available, step 430. For example, the adaptive multimode decoder 100 may transmit a message to the encoder of the transmitter to decrease the level of burst erasure correction coding from a rate ½ MS code to a rate ¾ MS code, or to shift to a multidescriptive or hybrid code, or if already using one of these codes, may not transmit any message or may transmit a message to maintain the current level of burst erasure or other correction encoding. Following step 430, the method proceeds to step 435, and decodes transmitted data packets utilizing the corresponding decoding scheme, such as utilizing the combined burst erasure and error corrector 170 for a corresponding level of burst erasure and random bit error correction and decoding. (As mentioned above for other possible encoding and corresponding decoding, with regard to step 435, depending upon the outcome of the various decision steps, and depending upon the encoding scheme currently being used, there may or may not be a change of types or degrees of decoding in step 435 from the type or degree of decoding previously used by the adaptive multimode decoder 100.)

Following step 435, the method determines whether the communication session has been completed, step 440. When the communication session is still in progress in step 440, the method returns to step 405, to continue to monitor data packet reception for burst erasures and other errors. When the communication session is completed in step 440, the method may end, return step 445.

Numerous advantages of the present invention may be readily apparent. The present invention provides for improved received signal quality using multiple modes of burst erasure and random bit error correction, providing for both burst erasure correction with optimally low delay, while simultaneously or alternatively providing for significant random bit error correction. The multiple mode and adaptive decoder of the present invention, in the presence of packet losses, provides for burst erasure correction with optimally low delay, and under other channel conditions, simultaneously or alternatively may provide for random bit error correction and/or increased source coding.

From the foregoing, it will be observed that numerous variations and modifications may be effected without departing from the spirit and scope of the novel concept of the invention. It is to be understood that no limitation with respect to the specific methods and apparatus illustrated herein is intended or should be inferred. It is, of course, intended to cover by the appended claims all such modifications as fall within the scope of the claims.

What is claimed is:

1. A method for adaptive multimode decoding for data packet-based communication, the method comprising:
 (a) detecting a burst erasure;
 (b) when a detected burst erasure has a burst erasure level which is greater than a first selected threshold, decoding a plurality of received data packets utilizing a first corresponding burst erasure correction code;
 (c) when a burst erasure has not been detected, decoding a plurality of received data packets utilizing a first corresponding random bit error correction code; and
 (d) when the detected burst erasure has a burst erasure level which is greater than a second selected threshold, the second selected threshold being greater than the first selected threshold, decoding a plurality of received data packets utilizing a second corresponding burst erasure correction code.

2. The method of claim 1, wherein the first corresponding burst erasure correction code comprises a comparatively higher rate burst erasure correction code and the second corresponding burst erasure correction code comprises a comparatively lower rate burst erasure correction code.

3. The method of claim 1, wherein the first corresponding burst erasure correction code comprises a rate ¾ burst erasure correction code and the second corresponding burst erasure correction code comprises a rate ½ burst erasure correction code.

4. The method of claim 1, further comprising:
 (e) when the detected burst erasure has a first burst erasure level which is greater than the first selected threshold and is not greater than the second selected threshold, decoding a plurality of received data packets utilizing a multidescriptive burst erasure and random bit error correction code.

5. The method of claim 1, further comprising:
 (e) when the detected burst erasure has a first burst erasure level which is greater than the first selected threshold and is not greater than the second selected threshold, decoding a plurality of received data packets utilizing a hybrid burst erasure and random bit error correction code.

6. The method of claim 1, wherein step (b) further comprises:
 transmitting a message to a corresponding encoder requesting encoding of a plurality of data packets for transmission using the first corresponding burst erasure correction code.

7. The method of claim 1, wherein step (c) further comprises:
transmitting a message to a corresponding encoder requesting encoding of a plurality of data packets for transmission using the first corresponding random bit error correction code.

8. The method of claim 1, wherein the first corresponding burst erasure correction code is a maximally short code.

9. The method of claim 1, wherein the first corresponding burst erasure correction code is a maximally short code having a rate R and having integer parameters m and s, in which $$R = \frac{ms+1}{ms+1+s},$$

and wherein the first corresponding burst erasure correction code has a capacity of correcting erasure bursts of s erasures relative to a guard length (g) and decoding delay (T) in which g=T=ms+1.

10. An apparatus for adaptive multimode decoding for data packet-based communication, the apparatus comprising:
a state detector operative to detect a burst erasure;
a burst erasure corrector coupled to the state detector, the burst erasure corrector adapted, when a detected burst erasure has a burst erasure level which is greater than a first selected threshold, to decode a plurality of received data packets utilizing a first corresponding burst erasure correction code; and further adapted, when the detected burst erasure has a burst erasure level which is greater than a second selected threshold, the second selected threshold being greater than the first selected threshold, to decode a plurality of received data packets utilizing a second corresponding burst erasure correction code; and
an error corrector coupled to the state detector, the error corrector coupled to the state detector, the error corrector operative, when a burst erasure has not been detected, to decode transmitted data packets utilizing a first corresponding random bit error correction code.

11. The apparatus of claim 10, wherein the state detector is further operative, when the state detector has detected a burst erasure, to select output data from the burst erasure corrector.

12. The apparatus of claim 10, wherein the state detector is further operative, when the state detector has not detected a burst erasure, to select output data from the error corrector.

13. The apparatus of claim 10, wherein the error corrector is a Viterbi decoder.

14. The apparatus of claim 10, wherein the first corresponding burst erasure correction code comprises a comparatively higher rate burst erasure correction code and the second corresponding burst erasure correction code comprises a comparatively lower rate burst erasure correction code.

15. The apparatus of claim 14, wherein the first corresponding burst erasure correction code comprises a rate ¾ burst erasure correction code and the second corresponding burst erasure correction code comprises a rate ½ burst erasure correction code.

16. The apparatus of claim 10, further comprising:
a combined erasure and error corrector coupled to the state detector, the combined erasure and error corrector operative, when the detected burst erasure has a first burst erasure level which is greater than the first selected threshold and is not greater than a second selected threshold, to decode a plurality of received data packets utilizing a multidescriptive burst erasure and random bit error correction code.

17. The apparatus of claim 10, further comprising:
a combined erasure and error corrector coupled to the state detector, the combined erasure and error corrector operative, when the detected burst erasure has a first burst erasure level which is greater than the first selected threshold and is not greater than a second selected threshold, to decode a plurality of received data packets utilizing a hybrid burst erasure and random bit error correction code.

18. The apparatus of claim 10, wherein the state detector is further operative to transmit a message to a corresponding encoder requesting encoding of a plurality of data packets for transmission using the first corresponding burst erasure correction code.

19. The apparatus of claim 10, wherein the state detector is further operative to transmit a message to a corresponding encoder requesting encoding of a plurality of data packets for transmission using the first corresponding random bit error correction code.

20. The apparatus of claim 10, wherein the first corresponding burst erasure correction code is a maximally short code.

21. The apparatus of claim 10, wherein the first corresponding burst erasure correction code is a maximally short code having a rate R and having integer parameters m and s, in which $$R = \frac{ms+1}{ms+1+s},$$

and wherein the first corresponding burst erasure correction code has a capacity of correcting erasure bursts of s erasures relative to a guard length (g) and decoding delay (T) in which g=T=ms+1.

22. The apparatus of claim 10, wherein the apparatus is embodied as a processor.

23. The apparatus of claim 10, wherein the apparatus is embodied within a receiver.

24. The apparatus of claim 23, wherein the receiver is coupleable to a transmitter through a data packet-based communication channel to form a system for adaptive multimode decoding, and wherein the transmitter includes an adaptive encoder.

25. An apparatus for adaptive multimode decoding for data packet-based communication, the apparatus comprising:
means for detecting a burst erasure;
means for decoding a plurality of received data packets utilizing a first corresponding burst erasure correction code when a detected burst erasure has a burst erasure level which is greater than a first selected threshold;
means for decoding the plurality of received data packets utilizing a second corresponding burst erasure correction code when the detected burst erasure has a burst erasure level which is greater than a second selected threshold, the second selected threshold being greater than the first selected threshold;

means for decoding a plurality of received data packets utilizing a first corresponding random bit error correction code when a burst erasure has not been detected; and means for selecting output data, the means for selecting output data responsive to a detected burst erasure to output burst erasure corrected data, and further responsive, when a burst erasure has not been detected, to output random bit error corrected data.

26. The apparatus of claim 25, further comprising:

means for decoding a plurality of received data packets utilizing a multidescriptive burst erasure and bit error correction code when the detected burst erasure has a first burst erasure level which is greater than the first selected threshold and is not greater than the second selected threshold.

27. The apparatus of claim 25, further comprising:

means for decoding a plurality of received data packets utilizing a hybrid burst erasure and bit error correction code when the detected burst erasure has a first burst erasure level which is greater than the first selected threshold and is not greater than the second selected threshold.

28. The apparatus of claim 25, further comprising:

means for transmitting a message to a corresponding encoder requesting encoding of a plurality of data packets for transmission using the first corresponding burst erasure correction code or the first corresponding random bit error correction code.

29. The apparatus of claim 25, wherein the first corresponding burst erasure correction code is a maximally short code having a rate R and having integer parameters m and s, in which $$R = \frac{ms+1}{ms+1+s},$$

and wherein the first corresponding burst erasure correction code has a capacity of correcting erasure bursts of s erasures relative to a guard length (g) and decoding delay (T) in which g=T=ms+1.

* * * * *